(12) United States Patent
Jereza (10) Patent No.: US 8,188,587 B2
(45) Date of Patent: May 29, 2012

(54) SEMICONDUCTOR DIE PACKAGE INCLUDING LEAD WITH END PORTION

(75) Inventor: Armand VIncent C. Jereza, Cebu City (PH)

(73) Assignee: Fairchild Semiconductor Corporation, South Portland, ME (US)

( * ) Notice: Subject to any disclaimer, the term of this patent is extended or adjusted under 35 U.S.C. 154(b) by 467 days.

(21) Appl. No.: 12/266,217

(22) Filed: Nov. 6, 2008

(65) Prior Publication Data

US 2010/0109135 A1    May 6, 2010

(51) Int. Cl.
*H01L 23/48* (2006.01)

(52) U.S. Cl. ........ 257/690; 257/666; 257/676; 257/678; 257/692; 257/696; 257/718; 257/719; 438/122; 438/123; 438/124

(58) Field of Classification Search .............. 257/666, 257/676, 690, 696, 678, 692, 718; 438/122, 438/123, 124

See application file for complete search history.

(56) References Cited

U.S. PATENT DOCUMENTS

| | | | |
|---|---|---|---|
| 5,835,988 A | 11/1998 | Ishii | |
| 6,111,312 A * | 8/2000 | Hirumuta et al. | 257/696 |
| 6,198,160 B1 | 3/2001 | Yamaguchi | |
| 6,249,041 B1 | 6/2001 | Kasem et al. | |
| 6,307,755 B1 * | 10/2001 | Williams et al. | 361/813 |
| 7,057,273 B2 | 6/2006 | Harnden et al. | |
| 7,285,849 B2 | 10/2007 | Cruz et al. | |
| 7,315,077 B2 | 1/2008 | Choi et al. | |
| 7,332,806 B2 | 2/2008 | Joshi et al. | |
| 2002/0113301 A1 * | 8/2002 | Tai | 257/678 |
| 2007/0040250 A1 * | 2/2007 | Kajiwara et al. | 257/673 |

OTHER PUBLICATIONS

DiStefano, T. et al.; Novel Uses of Flexible Circuit Technology in High Performance Electronic Applications; 1996, *Microelectronics International*, vol. 39, pp. 11-15.

* cited by examiner

*Primary Examiner* — A. Sefer
*Assistant Examiner* — Farid Khan
(74) *Attorney, Agent, or Firm* — Kilpatrick Townsend & Stockton LLP (57) ABSTRACT

A semiconductor die package, and methods of making the same. The package includes a leadframe and a clip structure. The clip structure is formed, such that a portion of the clip structure points towards the semiconductor die and is coplanar with the leadframe. The semiconductor die package further includes a housing material covering at least a portion of the leadframe, the semiconductor die, and the clip structure. The housing material has an external recess that holds a portion of the clip structure.

10 Claims, 11 Drawing Sheets

SEMICONDUCTOR DIE PACKAGE INCLUDING LEAD WITH END PORTION

CROSS-REFERENCES TO RELATED APPLICATIONS

NOT APPLICABLE

BACKGROUND

Semiconductor die packages are known in the semiconductor industry, but could be improved. For example, electronic devices such as wireless phones and the like are becoming smaller and smaller. It is desirable to make smaller semiconductor die packages, so that they can be incorporated into such electronic devices. However, smaller packages often require smaller semiconductor dies. This can impact performance and increase contact resistance. It would also be desirable to improve upon the heat dissipation properties of conventional semiconductor die packages. Semiconductor die packages including power transistors, for example, generate a significant amount of heat. It would also be desirable to provide end users of such semiconductor die packages with robust interconnection options.

Embodiments of the invention address these and other problems, individually and collectively.

BRIEF SUMMARY

Embodiments of the invention are directed towards semiconductor die packages and their methods of manufacture, substrates and their methods of manufacture, and systems for use in forming substrates.

One embodiment of the invention comprises a semiconductor die package. The semiconductor die package comprises a semiconductor die comprising a first surface and a second surface opposite the first surface, a leadframe structure attached to the first surface of the semiconductor die, and a clip structure attached to the second surface of the semiconductor die. The clip structure includes an end segment that points towards the semiconductor die and is substantially coplanar with the leadframe structure.

Another embodiment of the invention comprises a method of forming a semiconductor device. The method comprises obtaining a semiconductor die, wherein the semiconductor die includes a first surface and a second surface opposite the first surface, attaching a leadframe structure to the first surface of the semiconductor die, attaching a clip structure to the second surface of the semiconductor die, wherein the clip structure includes a lead portion, and bending the lead portion so that an end segment of the lead portion points toward the semiconductor die and is substantially coplanar with the leadframe structure.

These and other embodiments of the invention are described in detail in the Detailed Description with reference to the Figures. In the Figures, like numerals may reference like elements and descriptions of some elements may not be repeated. In addition, in the Figures, some elements may not be drawn to scale. Some elements may be shown as being larger or smaller than other elements for ease of illustration.

DETAILED DESCRIPTION

Embodiments of the present invention will be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure is thorough and complete and fully conveys the scope of the invention to one skilled in the art. In the drawings, the thicknesses of layers and regions may be exaggerated for clarity. The same reference numerals are used to denote the same elements throughout the specification.

Embodiments of the invention are directed to semiconductor packages, clip structures, assemblies using the semiconductor packages, and methods of making the same. In an exemplary embodiment, a semiconductor die package includes a semiconductor die. The semiconductor die can have a first surface, a second surface opposite the first surface, and there can be a leadframe structure attached to the first surface. A clip structure can be attached to the second surface of the semiconductor die, wherein the clip structure includes a lead portion. The lead portion can be formed so that an end segment of the lead portion both points towards the semiconductor die and is substantially coplanar with the leadframe structure. Embodiments of the packages and methods according to the invention will be described below in greater detail with references to the figures.

As used herein, "substantially coplanar" can include at least a horizontal portion of the end segment and a leadframe structure lying within the same horizontal plane or within a short distance (e.g., 1, mm) of each other.

Figure 1:
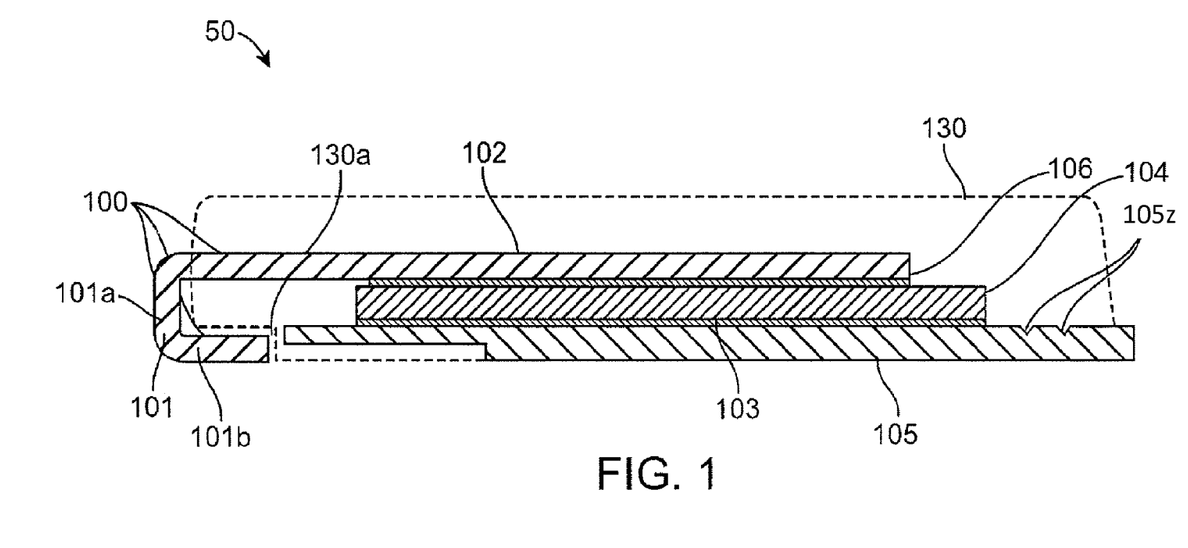
FIG. 1 illustrates a side view of a semiconductor die package according to an embodiment of the invention.

FIG. 1 shows a side view of a semiconductor die package 50 according to an embodiment of the invention. A semiconductor die 104 is attached on a first surface to leadframe structure 105 with connection material 103, such as a die attach pad adhesive, solder, or epoxy. The semiconductor die 104 is attached on a second surface to clip structure 100 with a connection material 106, such as solder. The leadframe structure 105 may contain one or more notches 105z, for mold locking.

In certain embodiments, a covering, such as molding material 130, at least partially covers the clip structure 100, the semiconductor die 104, and the leadframe structure 105. For clarity of illustration, the molding material 130 is shown as transparent and is bounded by dotted lines. A recess 130a, is formed within molding material 130. In other embodiments, the covering comprises other suitable materials, such as carrier tape. The recess 130a, may have a shape that is similar to, but slightly larger, than the shape of at least a portion of the end segment 101b. The recess 130a, can be defined by rectangular surfaces, curved surfaces, etc.

Clip 100 includes a lead portion 101 that at least partially extends outside of molding material 130. In this embodiment, lead portion 101 is bent in two places and includes both a side segment 101a, and an end segment 101b. The lead portion 101 is bent so that end segment 101b, points towards the semiconductor die (i.e., pointing into the package). Furthermore, the end segment is substantially coplanar with at least a portion of leadframe structure 105. This structure allows for greater surface area of the clip structure to contact solder (or other connective means), which can lead to improved connections between the semiconductor die package and a substrate (not shown). Also in FIG. 1, the end segment 101b, is cooperatively structured with the shape of the recess 130a, formed in the molding material 130. The surfaces of the end segment may contact the molding material 130 in some embodiments, but may not in other embodiments.

Figure 10A:
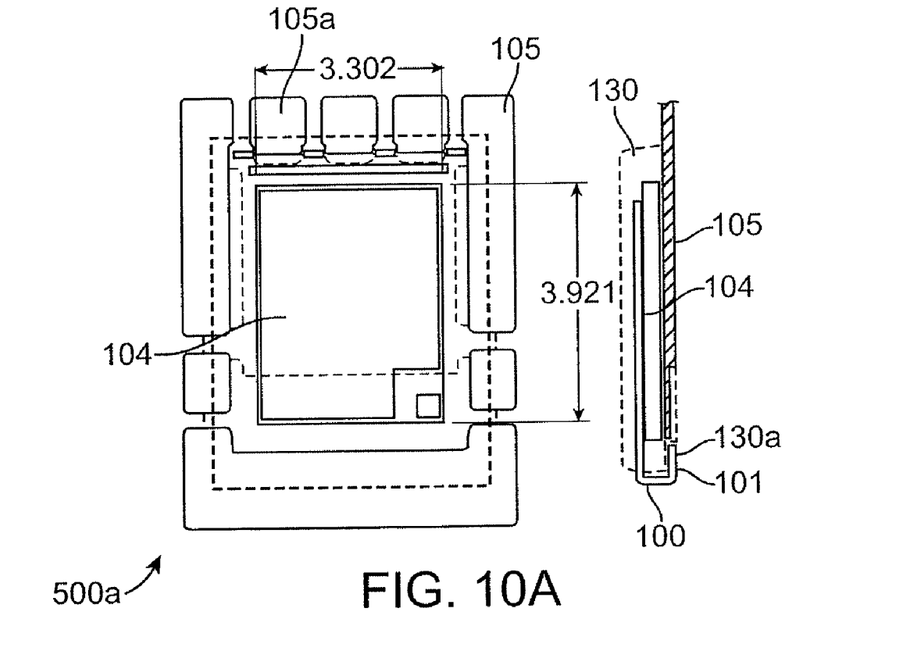
FIGS. 10A and 10B illustrate side and top views of a package configuration according to an embodiment of the invention and a conventional package configuration, respectively.
Figure 10B:
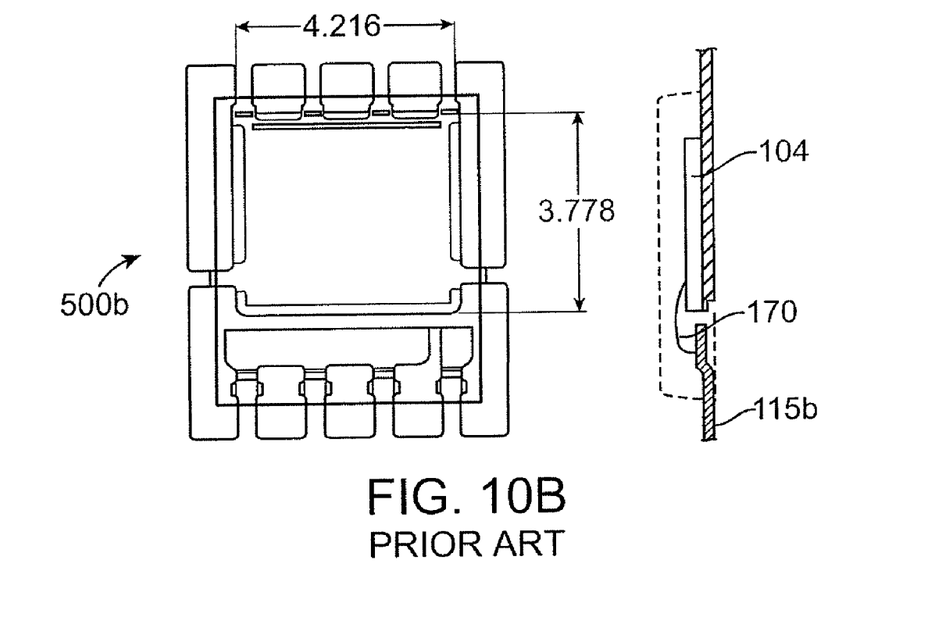

Embodiments of the invention can also provide for an extended die attach pad (DAP) surface, which allows for larger semiconductor die sizes. Referring to FIGS. 10A-10B, embodiments of the invention increase DAP size by not having separate source and gate lead posts. FIG. 10B shows a top and side view of a conventional package configuration 500b. Package configuration 500b, has a separate leadframe portion 115b, for connecting to the source and gate connection of semiconductor die 104. Conventional packages have leadframe portion 115b, connect to the semiconductor die 104 by a wire 170. Leadframe portion 115b, takes up space within the package 500b,, resulting in less space for a semiconductor die compared to packages of certain embodiments of the invention, as depicted in FIG. 10A. FIG. 10A shows an embodiment of the invention with a package 500a that has a clip structure 100 that can connect to the gate and source connections of the semiconductor die 104 on one end, and function as gate and source leads 101 on the other end. The clip structure 100 can take up far less space within the package than leadframe portion 115b,, allowing for larger semiconductor dies. In certain implementations of the invention, the semiconductor package 500a, can accommodate a die 104 with a size of 130, mils×154, mils. This is an increase of approximately 40% over the maximum die sizes allowed by conventional packaging (such as in FIG. 10b), including standard 5X6PQFN packages. The extended DAP and concurrent larger die can reduce the RDSon compared to conventional packages with similar footprints.

Methods according to embodiments of the invention can be described with reference to FIGS. 2A-6D. Although the formation of one semiconductor die package is shown in FIGS. 2A-6D, in embodiments of the invention, semiconductor die packages may be formed in an array and in parallel with a number of other semiconductor die packages.

Figure 2A:
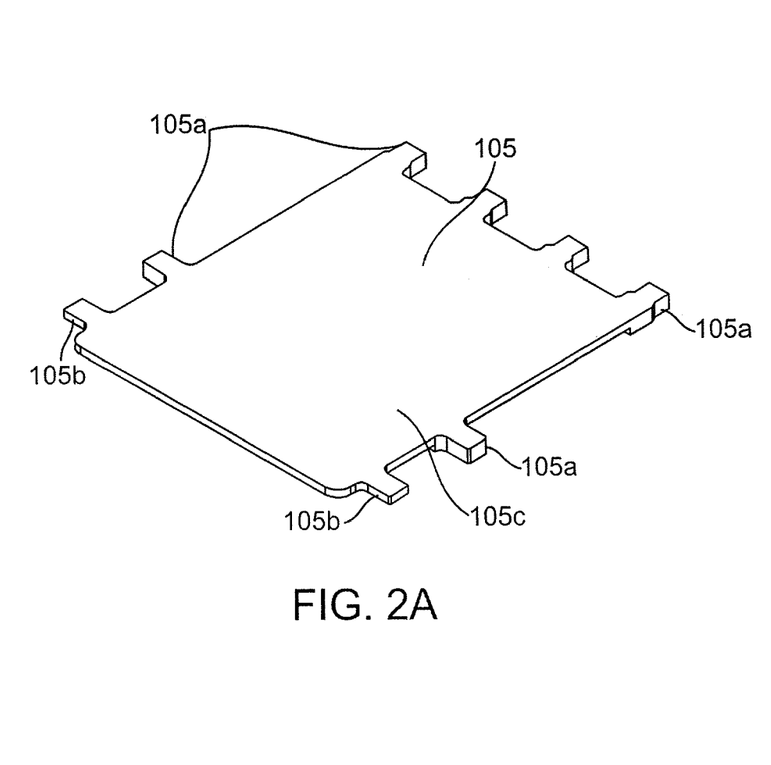
FIGS. 2A-2B illustrate top perspective views of precursors produced during the formation of a semiconductor die package according to an embodiment of the invention.

Referring to FIG. 2A, a leadframe structure 105 is formed or obtained. The term "leadframe structure" can refer to a structure that is derived from or is the same as a leadframe. Each leadframe structure can include one or more leads (105a,, 105b) with lead surfaces and a die attach region (e.g., a DAP) 105c. The leads 105a, and 105b, extend laterally from the die attach region. In certain embodiments, leads 105b, are tie bars to connect leadframe 105 to one or more other leadframes during processing, to allow for simultaneous processing of multiple packages.

The leadframe structure 105 may comprise any suitable material. Exemplary leadframe structure materials include metals such as copper, aluminum, gold, etc., and alloys thereof. The leadframe structures may also include plated layers such as plated layers of gold, chromium, silver, palladium, nickel, etc. The leadframe structure may also have any suitable thickness as known to one skilled in the art.

The leadframe structure 105 can be stamped, etched and/or patterned using conventional processes to shape the leads or other portions of the leadframe structure. For example, the leadframe structure 105 can be formed by etching a continuous conductive sheet to form a predetermined pattern. If stamping is used, the leadframe structure may be one of many leadframe structures in an array of leadframe structures that are connected by tie-bars. The leadframe structure array may also be cut to separate the leadframe structures from other leadframe structures. The leadframe structure 105 may be a continuous metallic structure or a discontinuous metallic structure.

Figure 2B:
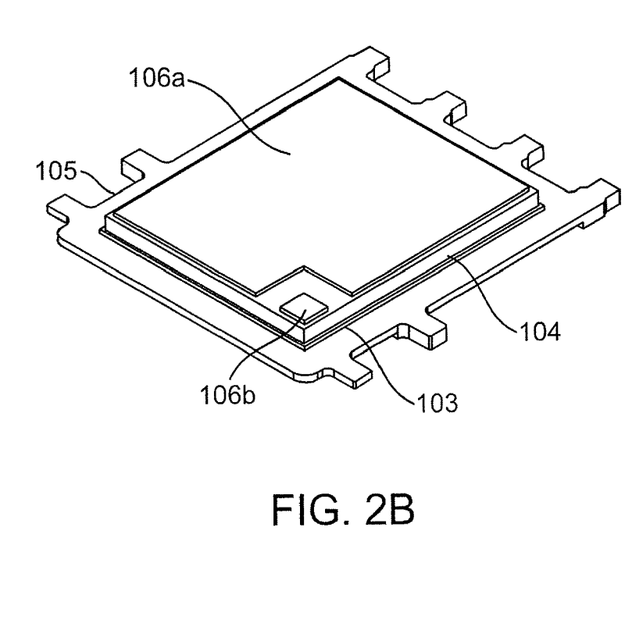

Referring to FIG. 2B, a semiconductor die 104 is attached to the leadframe structure 105. Die attach material 103 can be deposited on a semiconductor die 104 and/or on the leadframe structure 105, and then the semiconductor die 104 can be attached to the leadframe structure 105. The die attach material 103 can be deposited and cured using any suitable process. Any suitable type of solder or other type of conductive material such as a conductive epoxy may be used (e.g., PbSn or lead free solder). This allows leadframe structure 105 to be in electrical communication with a drain terminal of semiconductor die 104, so that one or more leads 105a, or 105b, can connect the drain of semiconductor die 104 with outside circuitry.

The semiconductor die 104 may include any suitable semiconductor device (such as a p-channel MOSFET die or an n-channel MOSFET die), and can be vertical or horizontal devices. Vertical devices have at least an input at one side of the die and an output at the other side of the die so that current can flow vertically through the die. Horizontal devices include at least one input at one side of the die and at least one output at the same side of the die so that current flows horizontally through the die.

Examples of some vertical devices, in certain implementations, include vertical power MOSFETs, vertical diodes, VDMOS transistors, vertical bipolar transistors, etc. Suitable semiconductors include silicon, silicon carbide, Gallium-Arsenide, and other so called "III-V" and "II-VI" semiconductor materials. A VDMOS transistor is a MOSFET that has two or more semiconductor regions formed by diffusion. It has a source region, a drain region, and a gate. The device is vertical in that the source region and the drain region are at opposite surfaces of the semiconductor die. The gate may be a trenched gate structure or a planar gate structure, and is formed at the same surface as the source region. Trenched gate structures can be narrower and occupy less space than planar gate structures. During operation, the current flow from the source region to the drain region in a VDMOS device is substantially perpendicular to the die surfaces.

After the leadframe structure 105 is attached to the semiconductor die 104, the clip structure 100 may be attached to the semiconductor die 105 (and thus also the leadframe structure 105) using connection material 106, such as solder (including soft solder) or some other type of conductive adhesive, such as a conductive epoxy. In one embodiment, connection material 106 is deposited on the semiconductor die 105 by suitable methods. In alternative embodiments, connection material (such as a gate and source connection material) is first deposited on the clip structure 100. Connection material 106 can include a source connection material 106a, and a gate connection material 106b,, as shown in FIG. 2B.

Figure 3A:
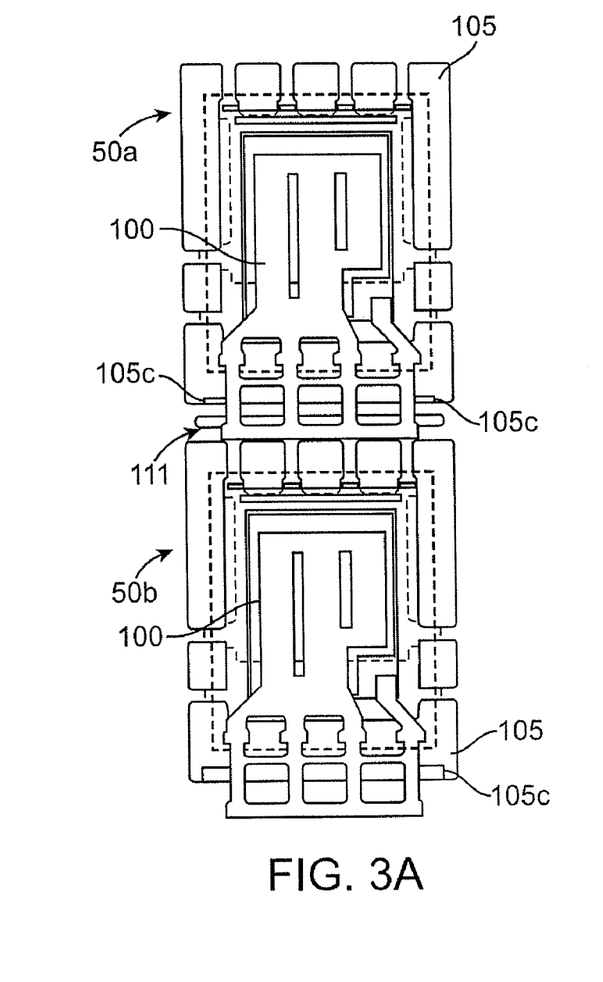
FIG. 3A shows a top view of a plurality of precursors produced during the formation of a semiconductor die package according to an embodiment of the invention.
Figure 3B:
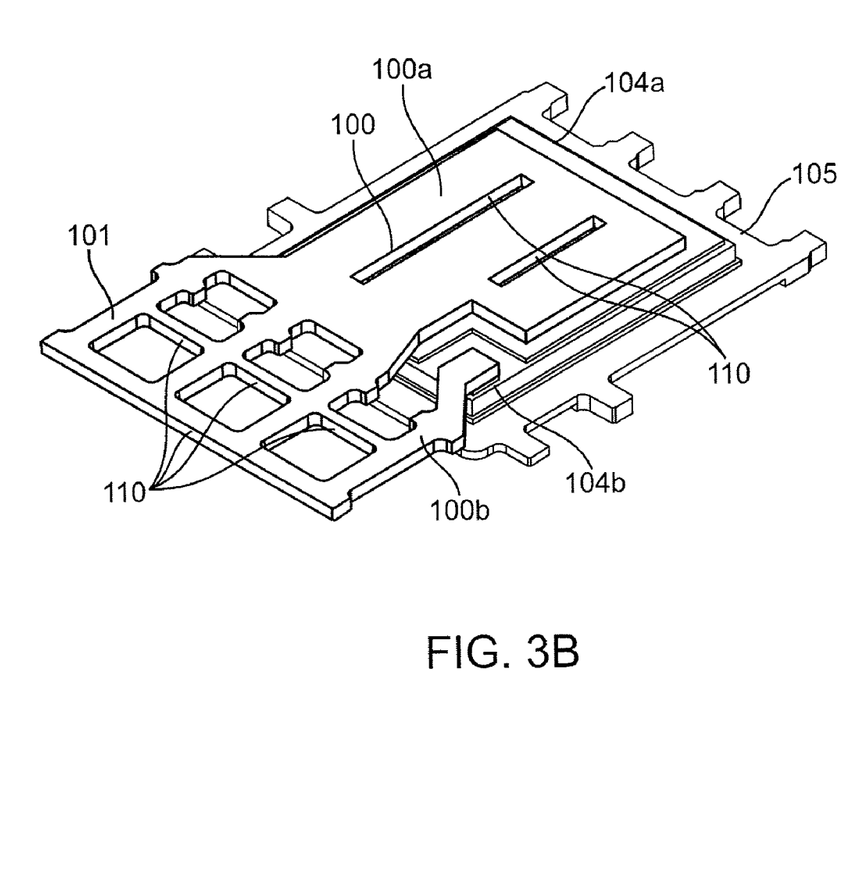
FIG. 3B shows a top perspective view a clip structure coupled to a precursor according to an embodiment of the invention

Referring to FIG. 3A, once the connection material has been deposited (on either or both of the semiconductor die 105 or the clip structure 100), the clip structure 100 can be attached to the semiconductor die 105. In the embodiment of FIG. 3A, multiple package precursors (50a,, 50b) can be formed simultaneously. A number of tie bars (not shown) can be used to join the leadframe of one package precursor to leadframes in an array of leadframes so that many packages can be produced in parallel. Clip structures 100 can be placed on semiconductor dies 104 by any suitable process, such as pick and place. In certain embodiments, alignment structures 105c, can be attached to, or formed as part of, leadframes 105. For each semiconductor die package, alignment structures 105c, can comprise one or more protrusions from the leadframe which are cooperatively configured with the clip structures 100. The alignment structures 105c, can stabilize the position of the clip structure 100 with respect to the leadframe structure 105, during attachment. The alignment structures 105c, can prevent misalignment of the clip structures 100 during attachment to the semiconductor dies 104.

A solder reflow or curing step may then take place followed by a cleaning step. A flux rinse may be performed for soft solder and a plasma process may be used for an epoxy material. This can result in the precursor shown in FIG. 3B. In exemplary embodiments, clip structure 100 comprises both a source clip 100a, and a gate clip 100b, held together by tie bars 110. In some embodiments, clip structure 100 can comprise only a source clip (i.e. not include a gate clip), or only a gate clip (i.e., not include a source clip). In these embodiments, a separate clip can be used to contact either the source or gate terminal connections of semiconductor die 105, or the source or gate terminals may be accessed by other suitable means. In certain embodiments, tie bars 110 can also connect the individual lead portions in the plurality of lead portions 101, to each other. In other embodiments, tie bars do not connect individual lead portions to each other. The source clip 100a, is in electrical contact with a source contact of the semiconductor die 105, and the gate clip 100b, is in electrical contact with a gate contact of the semiconductor die 105.

Figure 4A:
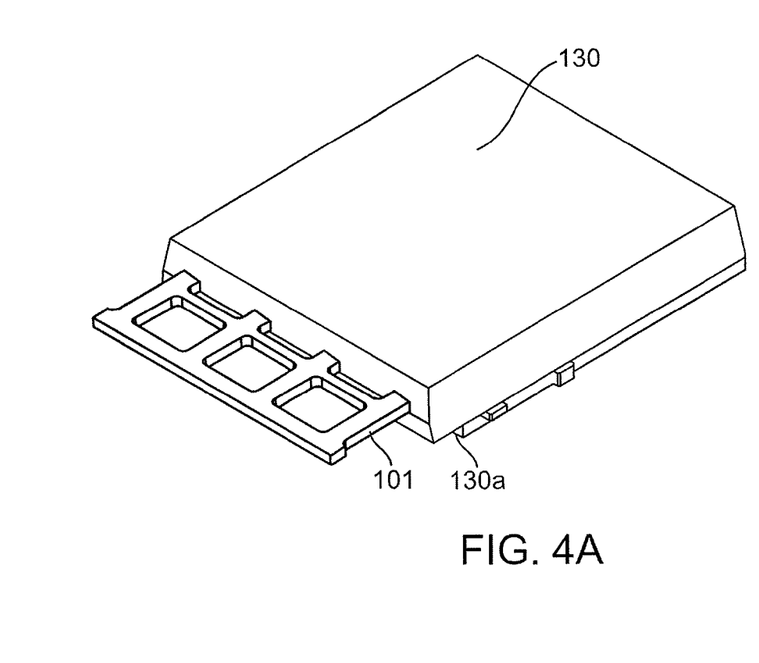
FIGS. 4A-4D illustrate views of molded precursors produced in the formation of a semiconductor die package according to an embodiment of the invention.

Referring to FIG. 4A, a molding step can be performed. A molding material 130 is molded around the package, and the package is separated (for embodiments where multiple packages are prepared simultaneously) and prepared such that it is ready for use in applications. The molding material may be molded using conventional molding processes. Suitable molding temperature and pressures may be determined by those of ordinary skill in the art. Once the package is molded, a deflash process can be performed to remove excess molding material. Also, as shown in FIG. 4A, a recess 130a, has been formed in molding material 130. The recess 130a, can be formed during the molding process (e.g., the mold cavity, not shown, used in molding can include a protrusion to match recess 130a). Alternative embodiments contemplate recess 130a, formed by other suitable means, such as removing molding material 130 to form recess 130a,, after the molding step has been performed.

Figure 4B:
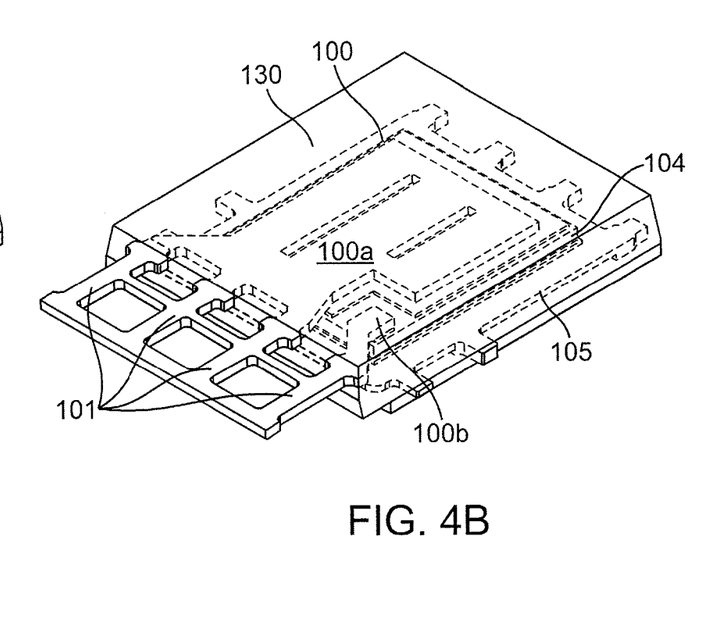
Figure 4C:
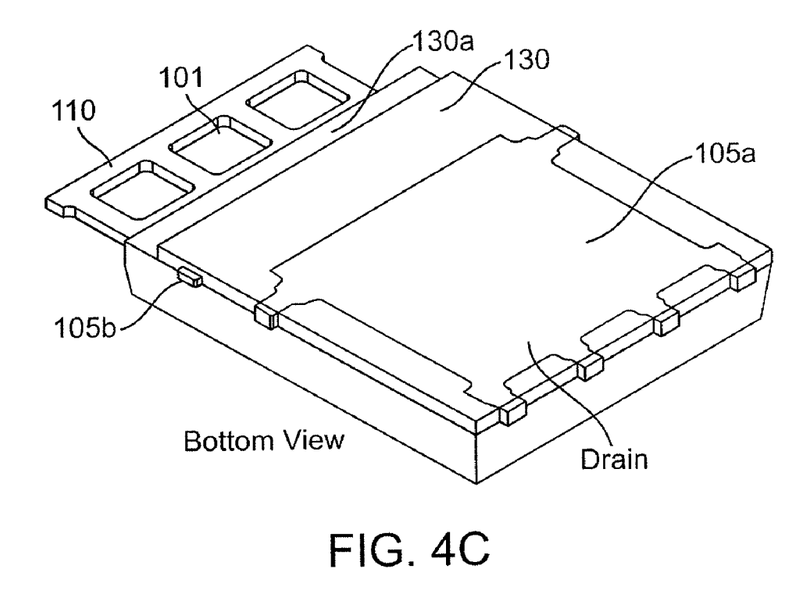
Figure 4D:
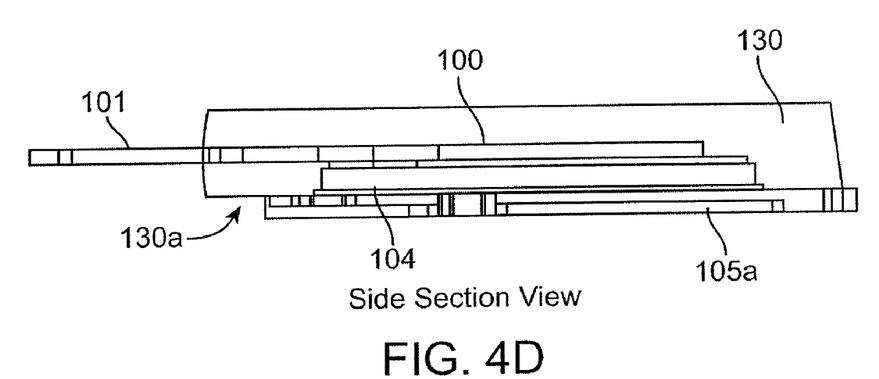

After the deflash process, the molding material 130 can expose certain areas for electrical or thermal connection, such as portions of leadframe structure 105 (including portions of drain connection 105a) and clip structure 100. The exposed portion of the clip structure 100 can include at least a part of lead portion 101. Also left exposed by the molding material can be a portion of the leadframe structure 101 comprising drain connection 105a and leads 105b, as shown in FIG. 4C. FIGS. 4B and 4D show a top perspective view and a side view, respectively, of an embodiment of a package precursor that has been molded. In FIGS. 4B and 4D, molding material 130 is semi-transparent to show internal package components. Molding material 130 at least partially covers the clip structure 100, the semiconductor die 104, and the leadframe structure 105.

Figure 5A:
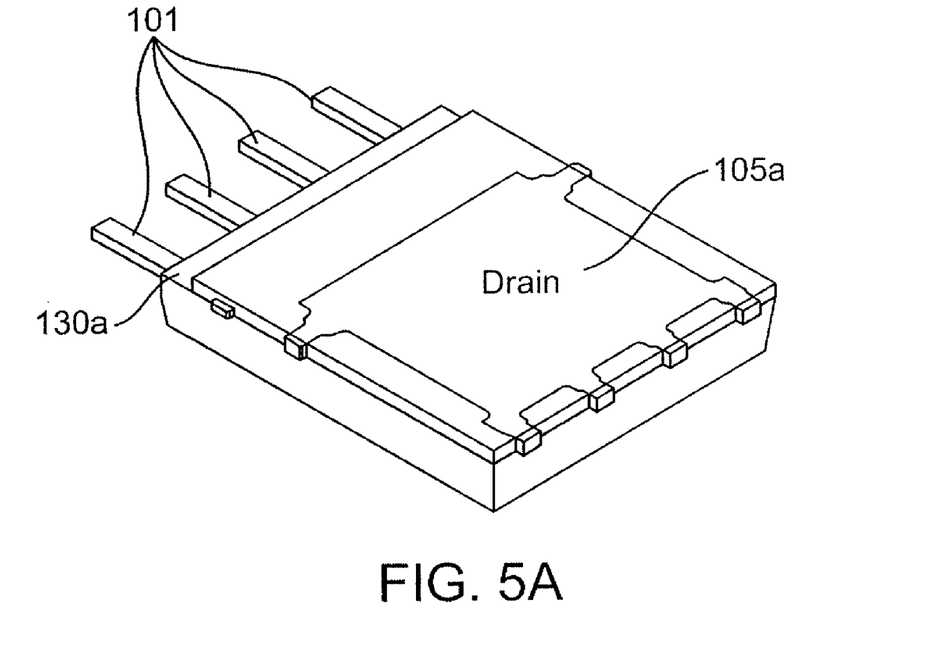
FIGS. 5A-5B illustrate views of tie bar removal according to an embodiment of the invention.
Figure 5B:
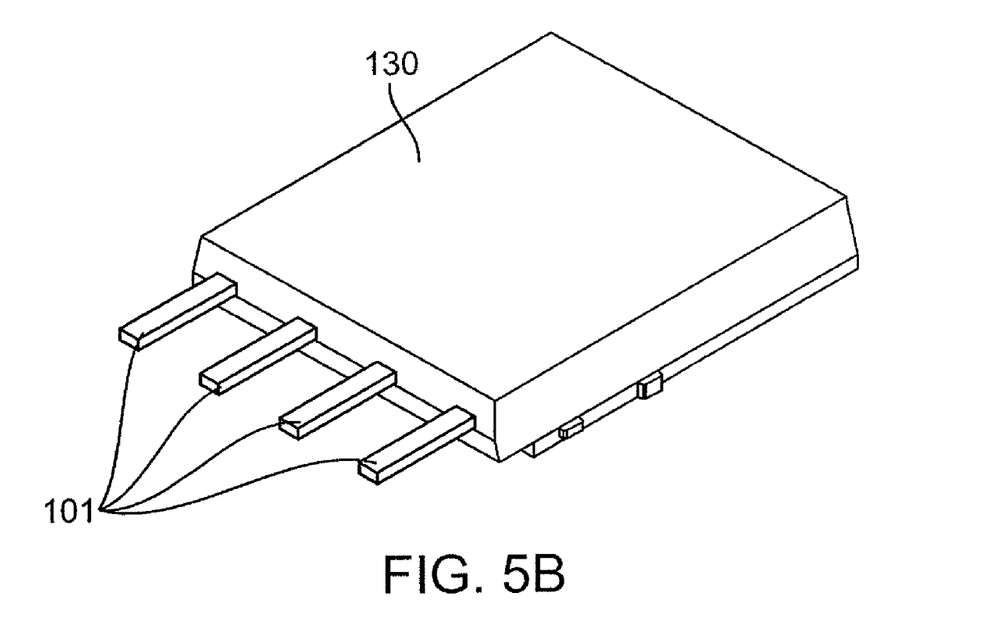

FIGS. 5A-5B show the process of singulation and tie bar removal according to exemplary embodiments. The removal of the tie bars 110 can occur in any suitable manner, and may be performed by etching or cutting as is known in the art. Singulation (for embodiments where multiple packages are prepared simultaneously) can be performed by suitable methods such as punch singulation, and may be performed concurrently, or before or after tie bar removal. Other embodiments contemplate other methods of singulation, including a water jet, laser, saw, etc.

Figure 8:
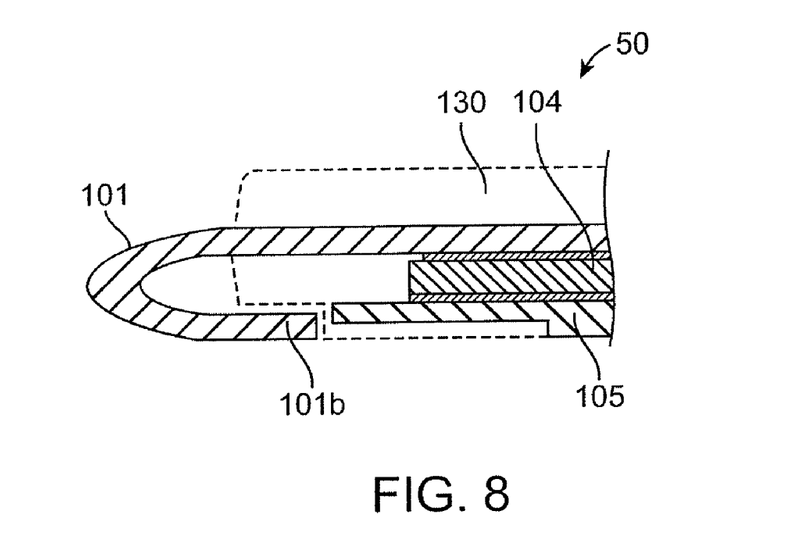
FIG. 8 illustrates a side view of a lead portion of a clip structure according to an alternative embodiment of the invention.

Referring to FIG. 6A-6D, the remaining lead portions 101 that are exposed by molding material 130 are formed, according to embodiments of the invention. The lead portions 101 are bent so that end segments 101b, point towards the semiconductor die 104 and are substantially coplanar with the leadframe 105. In certain embodiments, this is accomplished by a first bending of a first part of clip structure 100, and second bending of a separate part of clip structure 100. This forms the clip structure 100 (including body portion 102, and lead portions 101) to have a substantially U-shaped configuration, and the end segments 101b, are substantially parallel with the semiconductor die 104. The two bendings form end segments 101b, and side segments 101a, out of lead portions 101. Portions of end segments 101b, are within recess 130a. Lead portions 101 can be bent by suitable means, including the use of lead forming machines. In exemplary embodiments, side segments 101a are substantially perpendicular to both end segments 101b, and body portion 102 of the clip structure. In certain embodiments, the angle between side segments 101a, and end segments 101b, can be more or less than 90, degrees, and the angle between side segments 101a, and body portion 102 can be more or less than 90, degrees. In other embodiments, lead portions 101 are not bent in multiple places, but instead are continuously curved so that the "toe" ends of end segments 101b, point back towards semiconductor die 104 as shown in FIG. 8. FIGS. 6A-6D depict embodiments where side segments may be linear shaped. In certain implantations, side segments 101a, may be concave, convex, or other suitable shape.

Figure 6A:
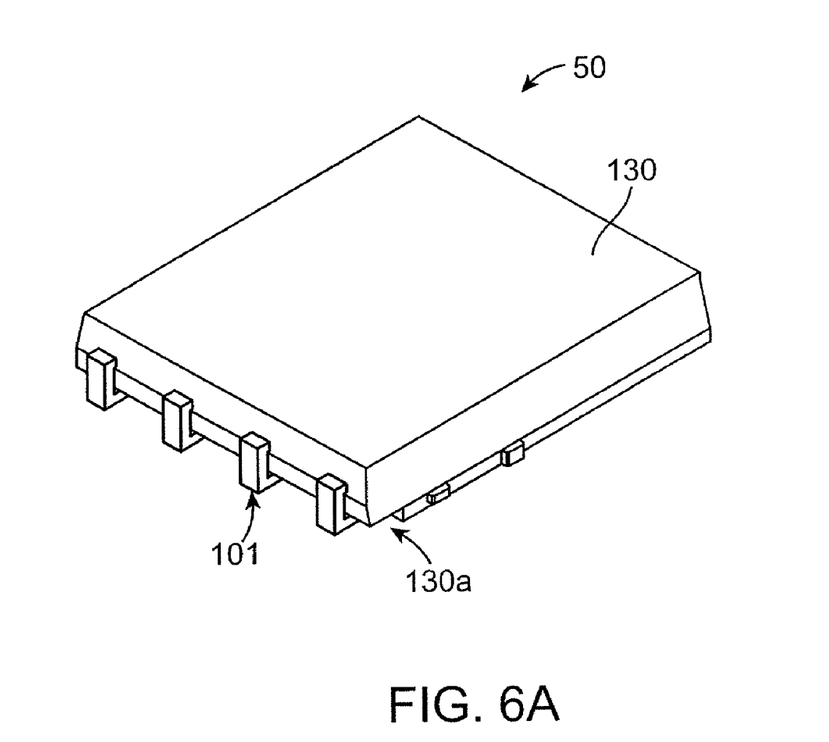
FIGS. 6A-6D illustrate views of lead forming according to an embodiment of the invention.
Figure 6B:
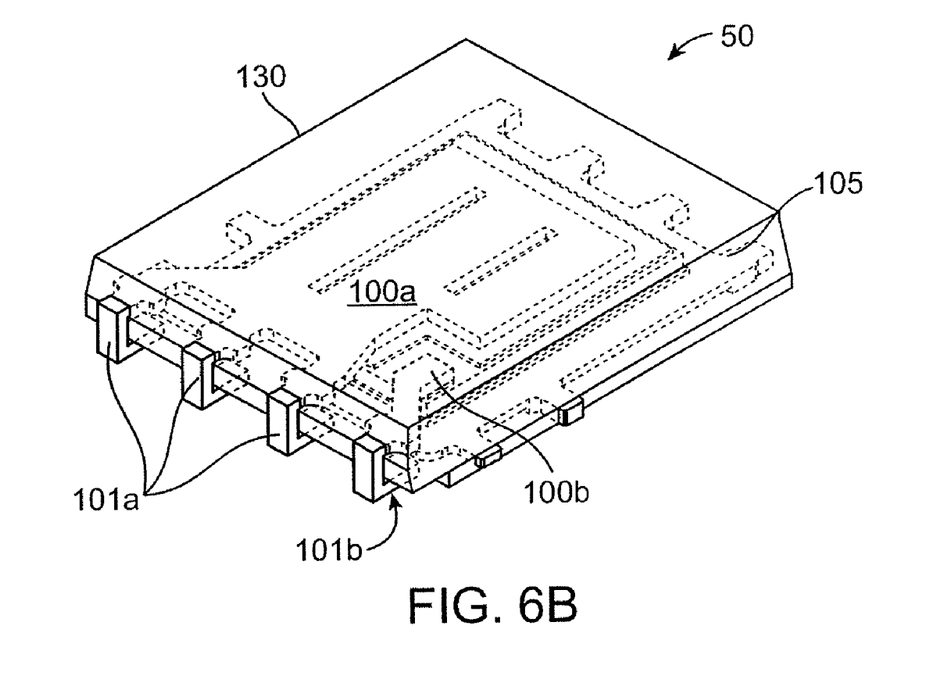
Figure 6C:
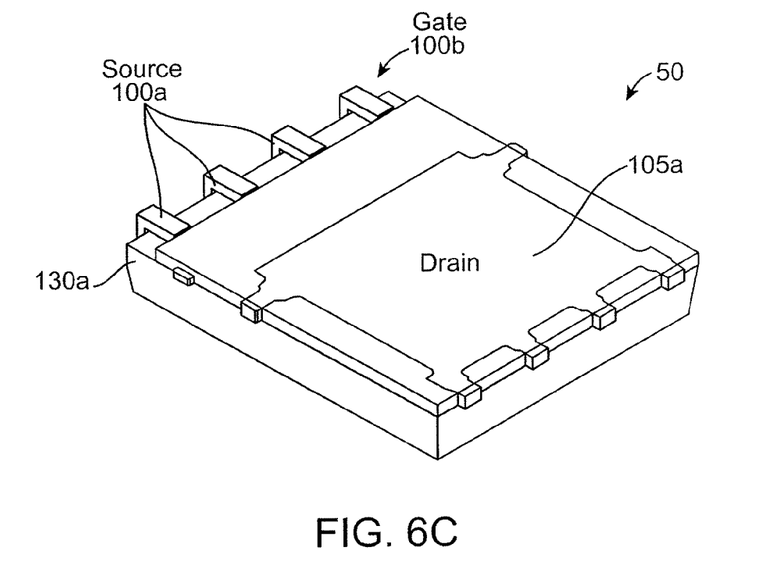
Figure 6D:
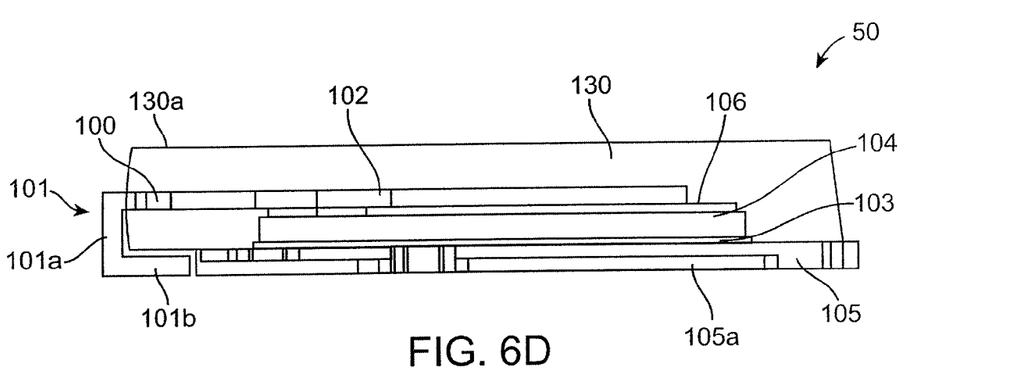

In FIGS. 6B and 6D, molding material 130 is semi-transparent to show internal package components. In exemplary embodiments, after the tie bar removal of FIG. 5A-5B, clip structure 100 comprises two independent (i.e., separate) clip structures: gate clip 100a, which is connected to a gate terminal of semiconductor die 104, and source clip 100b,, which is connected to a source terminal of semiconductor die 104. Source clip 100a, may include a plurality of source lead portions 101a,, which can point towards semiconductor die 104. Gate clip 100b, may include one or more gate lead portions 101b,, which can point towards semiconductor die 104. Combined, source lead portions 101a, and gate lead portions 101b comprise lead portions 101 of clip structure 100.

Gate clip 100b, comprises both external gate connections 101b, and an internal gate connection of the semiconductor die 104. Source clip 100a, comprises both external source connections 101a, and an internal source connection of the semiconductor die 104. This extends the DAP size of the semiconductor package 50, allowing for larger sized semiconductor dies. Such larger semiconductor dies lower the RDSon of the semiconductor package relative to prior art packages with a similar footprint.

In exemplary embodiments, apart of lead portions 101 (i.e., end segments 101b) are substantially coplanar with leadframe structure 105. In one aspect, the end segments 101b are substantially coplanar with leadframe 105, such that both the bottom surfaces of the end segments 101b, and the bottom surface of leadframe 105 are in substantially the same horizontal plane as each other. This can improve the connection of semiconductor package 50 with other electronics, such as a circuit board, as will be described in more detail below.

Figure 7:
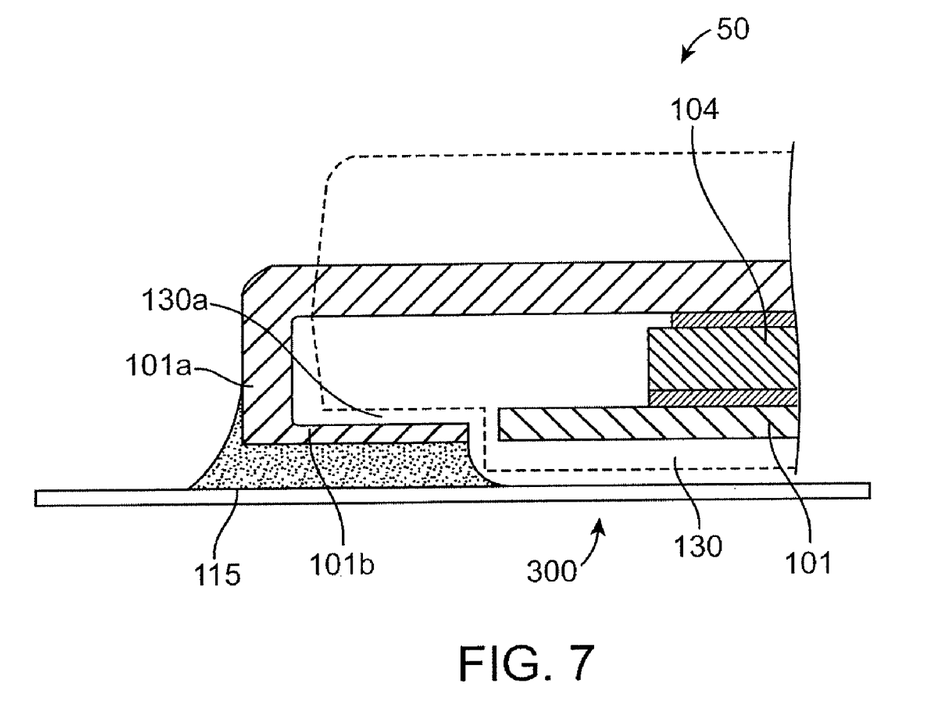
FIG. 7 illustrates a side view of a semiconductor package connected to a substrate according to an embodiment of the invention.

FIG. 7 shows a portion of semiconductor package 50 connected to an interconnect substrate 300 to form an electrical assembly. Interconnect substrate can comprise any suitable substrate, such as a printed circuit board or a flex substrate. Connection material 115 serves to physically and electrically connect semiconductor package 50 with interconnect substrate 300. In certain implementations, connection material 115 can comprise a solder joint (including Pb-based or Pb-free solder materials) or other suitable conductive adhesive, such as epoxy. Solder can be placed on one or both of the semiconductor package 50 and interconnect substrate 300, using various processes and/or materials including electroless nickel-gold, solder screen printing, pick and place, etc. Next, the semiconductor package 50 and interconnect substrate 300 can be brought together. A solder reflow or curing step may then take place followed by a cleaning step. A flux rinse may be performed for soft solder and a plasma process may be used for epoxy.

In certain embodiments, the bottom surface of semiconductor package 50 can be in contact with the interconnection substrate 300. In other exemplary embodiments, the semiconductor package 50 can be held a small distance away from the interconnection substrate 300 by the connection material 115, such that there can be a small gap between the semiconductor package 50 and the interconnection substrate 300, which may be a circuit board of the like In some embodiments, this gap can be eliminated or minimized with end portion 101b, being substantially coplanar with the bottom surface of the package 50. Forming lead portions 101 such that end segments 101b, are substantially coplanar with leadframe 105 can result in more compact electrical assemblies with superior electrical interconnections.

Formed lead portions 101 can provide greater surface area for connecting to a interconnect substrate (i.e., lead portions 101 have more solderable area). In exemplary embodiments, solder joint 115 connects to end segment 101b,, side segment 101a,, and the "toe" of end segment 101b. This provides superior solder joint reliability as well as greater electrical conduction due to less on-resistance. Furthermore, end segments 101b, point back towards the semiconductor die 104 (and thus towards the body portion 102 of clip structure 100). Thus the lead portions 101 have a compliant nature which can absorb stress, further increasing joint reliability. End segments point back towards the semiconductor die while within recess 130a, of the molding material 130. This allows the end segments to be substantially coplanar with leadframe 105, which can increase the solderable area while reducing external vertical or horizontal size of the semiconductor package.

Figure 9:
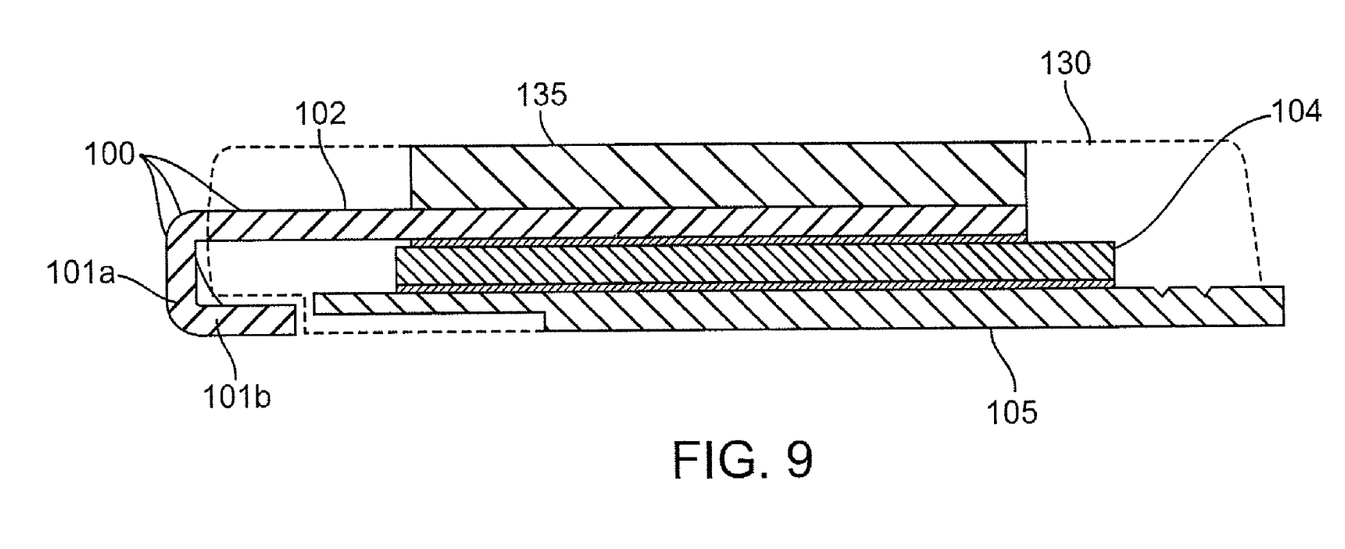
FIG. 9 illustrates a side view of a semiconductor package containing a further heat transfer element according to an alternative embodiment of the invention.

Referring to FIG. 9, certain embodiments of the invention contemplate including an exposed top side of a semiconductor package 50. A heat transfer element 135 (e.g. a heat spreader or heat slug) can be attached to the top side of clip structure 100, opposite the surface of the clip structure 100 that is attached to the semiconductor die 104. The heat transfer element 135 can be coupled with the clip structure 100 by thermal paste or other suitable thermally conductive material. Molding material 130 leaves exposed at least a portion of heat transfer element 135. In one example, the top surface of heat transfer element 135 is not covered (i.e., left exposed) by molding material 130. This improves heat dissipation from semiconductor package 50 leading to improved performance and packaging efficiencies.

Accordingly, it should be understood that where the performance of an action of any of the methods disclosed and claimed herein is not predicated on the completion of another action, the actions may be performed in any time sequence (e.g., time order) with respect to one another, including simultaneous performance and interleaved performance of various actions. (Interleaved performance may, for example, occur when parts of two or more actions are performed in a mixed fashion.) Accordingly, it may be appreciated that, while the method claims of the present application recite sets of actions, the method claims are not limited to the order of the actions listed in the claim language, but instead cover all of the above possible orderings, including simultaneous and interleaving performance of actions and other possible orderings not explicitly described above, unless otherwise specified by the claim language (such as by explicitly stating that one action precedes or follows another action).

The semiconductor die packages described above can be used in electrical assemblies including circuit boards with the packages mounted thereon. They may also be used in systems such as phones, computers, etc.

Any recitation of "a", "an", and "the" is intended to mean one or more unless specifically indicated to the contrary.

The terms and expressions which have been employed herein are used as terms of description and not of limitation, and there is no intention in the use of such terms and expressions of excluding equivalents of the features shown and described, it being recognized that various modifications are possible within the scope of the invention claimed.

Moreover, one or more features of one or more embodiments of the invention may be combined with one or more features of other embodiments of the invention without departing from the scope of the invention.

While the present invention has been particularly described with respect to the illustrated embodiments, it will be appreciated that various alterations, modifications, adaptations, and equivalent arrangements may be made based on the present disclosure, and are intended to be within the scope of the invention and the appended claims.

What is claimed is:

1. A semiconductor die package comprising:
a semiconductor die comprising a first surface and a second surface opposite the first surface;
a substantially planar leadframe structure attached to the first surface of the semiconductor die; and
a clip structure attached to the second surface of the semiconductor die, wherein the clip structure includes an end segment that points towards the semiconductor die and is substantially coplanar with the planar leadframe structure, and wherein the semiconductor die package further comprises a molding material at least partially covering the clip structure, the semiconductor die, and the leadframe structure, wherein the molding material defines a recess and wherein the end segment is within the recess in the molding material, but does not contact the molding material, wherein the leadframe structure is electrically connected to a drain terminal on the semiconductor die, and further wherein the molding material leaves exposed a drain connection on the leadframe structure.

2. The semiconductor die package of claim 1, wherein the clip structure has a U-shaped configuration.

3. A semiconductor die package comprising:
a semiconductor die comprising a first surface and a second surface opposite the first surface;
a substantially planar leadframe structure attached to the first surface of the semiconductor die; and
a clip structure attached to the second surface of the semiconductor die, wherein the clip structure includes an end segment that points towards the semiconductor die and is substantially coplanar with the planar leadframe structure, and wherein the semiconductor die package further comprises a molding material at least partially covering the clip structure, the semiconductor die, and the leadframe structure, wherein the molding material defines a recess and wherein the end segment is within the recess in the molding material, but does not contact the molding material, wherein the clip structure is a source clip connected to a source terminal on the semiconductor die, and wherein the semiconductor die package further comprises:

a gate clip connected to a gate terminal on the semiconductor die, wherein the gate clip includes a gate lead portion, and further wherein the gate lead portion is formed so that an end segment of the gate lead portion is substantially coplanar with the leadframe structure.

4. An electrical assembly comprising:
the semiconductor die package of claim 1; and
a circuit board, wherein the semiconductor die package is connected to the circuit board.

5. The electrical assembly of claim 4, wherein the clip structure includes a side segment connected to the end segment, the electrical assembly further comprising:
a solder joint coupling the semiconductor die package to the circuit board, wherein the solder joint contacts both the end segment and the side segment of the clip structure.

6. The electrical assembly of claim 5, wherein the side segment is substantially perpendicular to the end segment.

7. The semiconductor die package of claim 1, wherein the leadframe further comprises one or more notches.

8. The semiconductor die package of claim 1, wherein the clip structure further comprises a second end segment opposite from a first end segment, wherein the second end segment is not bent.

9. The semiconductor die package of claim 8, wherein the second end segment of the clip structure is covered by the molding material.

10. The semiconductor die package of claim 1, wherein one or more of the leads of the leadframe structure partially extends outside the molding material.

* * * * *